(12) United States Patent
Takakuwa et al.

(10) Patent No.: US 7,674,407 B2
(45) Date of Patent: Mar. 9, 2010

(54) METHOD FOR MANUFACTURING MICROLENS AND METHOD FOR MANUFACTURING ORGANIC ELECTROLUMINESCENCE ELEMENT

(75) Inventors: Atsushi Takakuwa, Shiojiri (JP); Tatsuya Shimoda, Fujimi-machi (JP); Masahiro Furusawa, Chino (JP); Tadaoki Mitani, Asahidai 1-50-A34, Nomi-shi, Ishikawa-ken 923-1211 (JP); Hisato Yamaguchi, Ichihara (JP)

(73) Assignees: Seiko Epson Corporation, Tokyo (JP); Tadaoki Mitani, Nomi-shi (JP)

( * ) Notice: Subject to any disclaimer, the term of this patent is extended or adjusted under 35 U.S.C. 154(b) by 1194 days.

(21) Appl. No.: 11/141,641

(22) Filed: Jun. 1, 2005

(65) Prior Publication Data
US 2006/0007552 A1    Jan. 12, 2006

(30) Foreign Application Priority Data
Jul. 9, 2004    (JP)    ............... 2004-203923

(51) Int. Cl.
*B29D 11/00*    (2006.01)
*G02B 6/00*    (2006.01)

(52) U.S. Cl. ............... 264/1.7; 264/309; 264/DIG. 72

(58) Field of Classification Search ............... 264/2.7, 264/1.7, 309, DIG. 72
See application file for complete search history.

(56) References Cited

U.S. PATENT DOCUMENTS

| | | | |
|---|---|---|---|
| 5,316,640 A | 5/1994 | Wakabayashi et al. | |
| 6,116,516 A * | 9/2000 | Ganan-Calvo | ............... 239/8 |
| 6,402,996 B1 | 6/2002 | Border et al. | |
| 6,583,805 B2 | 6/2003 | Mashimo et al. | |
| 6,610,552 B2 | 8/2003 | Fujimori et al. | |
| 6,621,637 B2 | 9/2003 | Uchiyama et al. | |
| 6,727,513 B2 | 4/2004 | Fujimori et al. | |
| 6,825,867 B2 | 11/2004 | Koga et al. | |
| 2003/0062544 A1 | 4/2003 | Mochizuki | |

FOREIGN PATENT DOCUMENTS

| | | |
|---|---|---|
| JP | A-3-252603 | 11/1991 |
| JP | A 05-3079 | 1/1993 |

(Continued)

OTHER PUBLICATIONS

Cox, W.R., D.J. Hayes, T. Chen, D.W. Ussery, Fabrication of micro-optics by microjet printing, SPIE vol. 2383 (1995), pp. 110-115.*

(Continued)

*Primary Examiner*—Matthew J. Daniels
(74) *Attorney, Agent, or Firm*—Oliff & Berridge, PLC

(57) ABSTRACT

A method for manufacturing an organic thin film element that includes an organic thin film between a pair of thin film electrodes and at least one electrode being a transparent electrode includes forming a transparent electrode by spraying a material liquid containing a transparent electrode formation material on a base material, and forming an organic thin film on the transparent electrode. This method allows for the manufacture of the organic thin film element by which an organic thin film element with high light-extraction efficiency is simply provided. A method for manufacturing an electro-optic device and a method for manufacturing electronic equipment that utilize the method for manufacturing an organic thin film element are described.

6 Claims, 9 Drawing Sheets

FOREIGN PATENT DOCUMENTS

| | | |
|---|---|---|
| JP | A-5-136460 | 6/1993 |
| JP | A-10-223367 | 8/1998 |
| JP | A 11-354271 | 12/1999 |
| JP | A-2000-199805 | 7/2000 |
| JP | A 2002-237383 | 8/2002 |
| JP | A-2003-19826 | 1/2003 |
| JP | A-2003-98316 | 4/2003 |
| JP | A-2003-282255 | 10/2003 |
| JP | A-2004-039500 | 2/2004 |
| KR | 2002-0029397 | 4/2002 |
| KR | 2002-0077143 | 10/2002 |
| KR | 2003-0025871 | 3/2003 |
| TW | 223105 B | 11/2004 |
| WO | WO03007663 * | 1/2003 |

OTHER PUBLICATIONS

Kim, E., G.M. Whitesides, Use of Minimal Free Energy and Self-Assembly to Form Shapes, Chem. Mater., vol. 7 (1995), pp. 1257-1264.*

* cited by examiner

METHOD FOR MANUFACTURING MICROLENS AND METHOD FOR MANUFACTURING ORGANIC ELECTROLUMINESCENCE ELEMENT

This application claims the benefit of Japanese Patent Application No. 2004-203923filed Jul. 9, 2004. The entire disclosure of the prior application is hereby incorporated by reference herein in its entirety.

BACKGROUND

The exemplary embodiments relate to a method for manufacturing a microlens and a method for manufacturing an organic electroluminescence element.

An organic electroluminescence element (hereinafter referred to as an organic EL element), which is a self lightemitting element that itself emits light by the flow of a current, is excellent in visibility as well as shock resistance, and has excellent characteristics of low power consumption in comparison with an inorganic EL. The organic EL element is drawing attention as the next generation display device due to these excellent characteristics.

The organic EL element typically includes a substrate, an anode, an organic luminescent layer, and a cathode. In the organic EL element, total reflection occurs at a layer interface due to the refractive index difference between materials that constitute layers. The light that is confined to the layer by the total reflection is propagated in the transverse direction of the substrate, and then causes edge emitting or nonradiatively disappears in the course of propagation. As a result, the amount of light that emits outside is reduced and the lightextraction efficiency decreases up to about 20%, for example.

To address or solve such a problem, methods of forming prisms and microlenses on or around an organic EL element to improve the light-extraction efficiency are disclosed, for example, in Japanese Unexamined Patent Publication No. 2003-282255 and Japanese Unexamined Patent Publication No. 2004-39500.

SUMMARY

In the above patent documents, however, the shape of a mold is transferred to a base material, and therefore microlenses are formed. Accordingly, a mold that is suitable for the design of a device to be manufactured is required. Other methods for manufacturing a microlens, manufacturing methods utilizing an ink-jet method and a photolithography technique are known. However, the ink-jet method has a disadvantage in that large amounts of microlenses cannot be produced at one time, and the photolithography technique has a disadvantage, in that the operation steps become complicated.

Therefore, the present exemplary embodiments provide a manufacturing method of a microlens and a manufacturing method of an organic EL element that permit efficient mass production of microlenses in a simple way.

To address or solve the above problem, the exemplary embodiments provide a method for manufacturing a microlens. The method includes: spraying and depositing a liquid onto a surface of a base material, the liquid having a low affinity to the surface of the base material, the liquid containing a material for forming a microlens; and hardening the liquid.

According to this method, the liquid with a low affinity to the surface of the base material is sprayed and therefore the liquid becomes substantially hemispheric on the base material. By hardening this liquid, a convex microlens can be obtained. Since a microlens is formed by spraying in this way, large amounts of microlenses can be formed at one time by simple processes, enabling the improvement of production efficiency.

Preferably the base material further has a substrate film that has a lower affinity to the liquid than the surface of the base material. Thus, a microlens can be formed regardless of the quality of the base material. The substrate film with a lower affinity is preferably a lyophobic substrate film.

Preferably the substrate film is formed of a self-assembled monolayer. Thus, a stable substrate film can be formed, and therefore the surface of the base material can keep lyophobicity for a long time.

Preferably the average particle diameter of the sprayed liquid is equal to or less than 1 µm. Thus, a minute microlens can be formed.

Preferably the average diameter of the microlens is equal to or less than 5 µm. According to the exemplary embodiments, such a minute microlens, and further a microlens of, for example, about 0.1 µm can be formed.

Preferably a contact angle between the liquid and the base material or the substrate film is equal to or more than 50°. Thus, there is a tendency that a microlens having a higher focal performance can be formed.

Another aspect of the exemplary embodiments is a method for manufacturing a microlens that includes: forming regions by patterning, the regions being formed with different affinities to the liquid on the base material; spraying and depositing a liquid onto a surface of the base material, the liquid containing a material for forming a microlens; and hardening the liquid.

According to this aspect, a microlens can be formed in a desired position with excellent accuracy. By adjusting the size of the region in which a pattern is to be formed, the size of a microlens can be altered.

Another aspect of the exemplary embodiments is a method for manufacturing a microlens that includes: spraying and depositing a liquid onto a surface of a base material, the liquid having a low affinity to the surface of the base material, the liquid containing a material for forming an etching protective film such that an etching film having a convex lens shape is formed; and transferring the shape of the etching film to the base material by etching the base material on which the etching film is formed.

According to this aspect, a microlens is formed by processing a base material, and therefore the microlens and the base material are integrated. Optical loss, or the like, because of the difference in material between the microlens and the base material, does not occur.

Another aspect of the exemplary embodiments is a method for manufacturing an organic EL element that includes: forming a first electrode film on a substrate; forming an organic compound layer that includes at least a luminescent layer on the first electrode film; and forming a second electrode film on the organic compound layer; a microlens being formed between any of a plurality of luminescent layers to a light exit surface of the organic EL element or on the light exit surface using any of the manufacturing methods of a microlens discussed above.

According to this aspect, the above described manufacturing method of a microlens can be utilized, and therefore an organic EL element that contains a microlens between layers or on the light exit surface and involves improved lightextraction efficiency can be manufactured efficiently in a simple way.

Preferably the refractive index difference between a material for forming the microlens and a material constituting the layer on which the microlens is formed is equal to or less than 0.05, and further equal to or less than 0.02. Further refractive indices of the material for forming the microlens and the material constituting the layer on which the microlens is formed are substantially equal. Thus, the optical loss because of the difference in material between the microlens and the layer on which the microlens is formed can be reduced.

The microlens may be formed on the first electrode film such that the emitted light from the luminescent layer may be collected in the direction of the light exit surface. The microlens may be formed on the substrate such that the emitted light from the luminescent layer is collected in the direction of the light exit surface. Forming a microlens between layers or on a substrate in this way permits collection of the emitted light from the luminescent layer and improvement of the light-extraction efficiency.

According to the manufacturing method of an organic EL element of the exemplary embodiment, a surface roughness Ra of a layer including the microlens can be reduced to, for example, 3 nm or less, and is preferably equal to or less than 1 nm.

Another aspect of the invention is an organic electroluminescence device composed of organic compound layers including a luminescent layer between a pair of electrodes, a layer including a group of minute microlenses having a surface roughness Ra equal to or less than 3 nm, and preferably equal to or less than 1 nm being located in a position from the luminescent layer to the light exit surface such that the emitted light from the luminescent layer is collected in the direction of the light exit surface.

According to this aspect, since the microlens is formed on a layer in a position from the luminescent layer to the light exit surface, the optical loss by the reflection of light in an organic compound layer can be prevented. The surface roughness Ra of a layer including a group of microlenses (hereinafter, a microlens layer) is equal to or less than a predetermined value, and therefore the film thickness variation among layers located on or above the microlens layer is affected by the unevenness of the surface of the microlens layer, and thus can be reduced.

The organic compound layer may include, in addition to the luminescent layer, a hole transfer layer, an electron injection layer, and other layers that are usually included in an organic EL element.

DETAILED DESCRIPTION OF EMBODIMENTS

A method for manufacturing a microlens according to the exemplary embodiments will be described below with reference to the drawings.

Figure 1A:
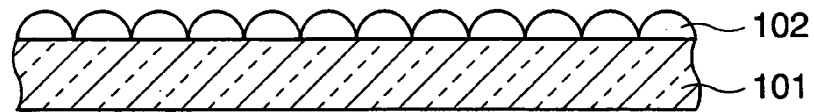
FIGS. 1A and 1B are schematics illustrating a method for manufacturing microlenses in an exemplary embodiment.
Figure 1B:
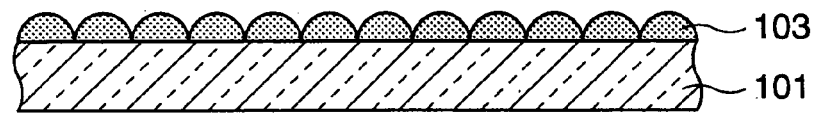

FIGS. 1A and 1B are views for illustrating the method for manufacturing microlenses of the present exemplary embodiment.

A liquid containing a material for forming a microlens is sprayed and deposited onto a surface of a substrate (base material) 101 shown in FIG. 1A such that a plurality of precursors 102 of microlenses (hereinafter, microlens precursors) is formed.

A method of spraying a liquid containing a material for forming a microlens is not particularly restricted. From the viewpoint of being able to form a minute microlens having an average diameter equal to or less than 1 µm, and preferably equal to or less than 0.5 µm, spraying a liquid as a particle having an average diameter equal to or less than 1 µm, and preferably equal to or less than 0.5 µm is preferred. Such a spraying method specifically includes, for example, a liquid source misted chemical deposition (LSMCD) method. This method can readily form a micron or sub micron size micro droplet.

A transparent or semitransparent material that can carry out the function as a lens after being hardened is sufficient as a material for forming a microlens, and particular restriction is not imposed. Specifically, a material for forming a microlens is suitably selected for applications, and, for example, inorganic glass such as soda lime glass, borosilicate glass, and silica glass; resin such as polyethylene terephthalate, polycarbonate, and polyacrylate; metal oxides such as ZnO and $TiO_2$; and metal nitrides such as $Si_3N$ are used. Mixtures of polymerizable monomers and polymerization initiators may also be used. In addition, a material of a transparent electrode and a material constituting an organic compound layer, which will be described below, may be used.

A liquid containing the above mentioned material in a state of dispersion or dissolution is also sufficient as a liquid containing a material for forming a microlens, and particular restriction is not imposed. However, the liquid that has a low affinity to a surface of the substrate 101 is preferable. The affinity of the liquid to the substrate 101 is relative and varies in accordance with the type of the substrate 101. As an index of the affinity of the liquid, which is not particularly restricted, for example, when an organic solvent is used as a solvent, a contact angle to the substrate 101 is preferably equal to 50° or more, more preferably equal to 60° or more, and further preferably equal to 70° or more. Such contact angles tend to enable the formation of a microlens having a higher focal performance.

The material quality of the substrate 101 is not particularly restricted, and is suitably selected for applications. If the substrate 101 is lyophobic, the range for selecting a liquid that can be used extends.

The shape of a microlens 103 (or the microlens precursor 102) can be adjusted by suitably controlling the concentration of a liquid, the degree of an affinity (a contact angle) between the liquid and the substrate 101, and the like.

The microlens precursor formed as described above is hardened as shown in FIG. 1B. Thus, a plurality of convex microlenses can be obtained at a time. A method for hardening is not particularly restricted, and hardening process is suitably performed according to the material used.

Figure 2A:
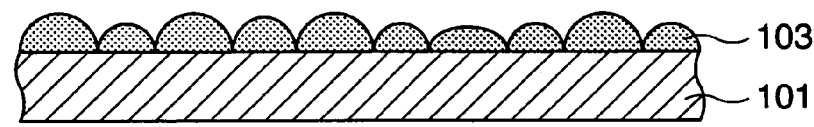
FIGS. 2A and 2B are schematics illustrating an example of microlenses manufactured by the manufacturing method in an exemplary embodiment.
Figure 2B:
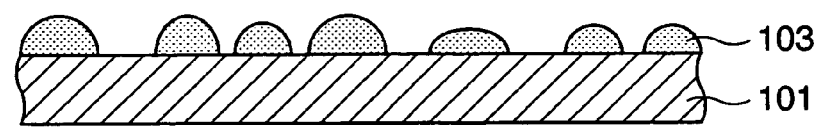

Additionally, the forms and the sizes of the plurality of formed microlenses may be either uniform or nonuniform as shown in FIGS. 2A and 2B.

In the case of the substrate 101 made of a lyophilic material, when a liquid is sprayed, the attached liquid to the substrate 101 is spread on the substrate 101, and therefore the form of a microlens may be not completed. In such a case, a lyophobic film may be formed as a substrate film 105 for forming a microlens.

Figure 3A:
FIGS. 3A, 3B, and 3C are schematics illustrating another example of a manufacturing method of a microlens in an exemplary embodiment.
Figure 3B:
Figure 3C:
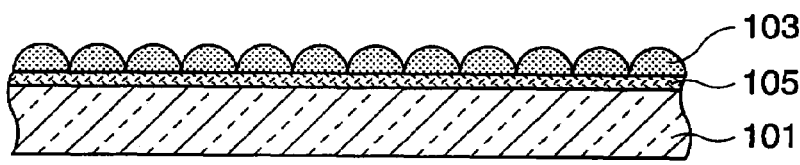

FIGS. 3A, 3B, and 3C are views for illustrating another example of the manufacturing method of a microlens of the present exemplary embodiment.

The substrate film 105 is formed on the substrate 101 shown in FIG. 3A (refer to FIG. 3B).

The substrate film 105 has a function for controlling the affinity to a liquid, and therefore the shape of a microlens can be adjusted by suitably changing a material quality of the substrate film 105. The material for forming such the substrate film 105 is not particularly restricted, and is suitably selected according to the shape and the material quality of a microlens, a contact angle to a liquid, applications, and the like. Thus, a material having a lower affinity to the material for forming a microlens, namely a material that is more lyophobic (having a larger contact angle to the liquid), than the substrate 101 may be used. As a result, a microlens having a higher aspect ratio (the ratio of a height (H) to a length of the bottom (L) is large) can be formed in comparison with the formation of a microlens directly on the substrate 101. As an index of the affinity to the liquid, which is not particularly restricted, for example, when an organic solvent is used as a solvent of a liquid containing a microlens formation material, a material having the contact angle preferably equal to 50° or more, more preferably equal to 60° or more, and further preferably equal to 70° or more, is preferred. Thus, there is a tendency that a microlens having a higher focal performance can be formed. Such materials specifically include resin with lyophobicity such as fluorocarbon polymers and polyolefins. From the viewpoint of excellent stability and smoothness, and the like, of the substrate film 105, the use of a self-assembled monolayer is preferable. Such lyophobic self-assembled monolayer include, for example, flouroalkylsilane (FAS). The self-assembled monolayer can be readily formed by known techniques such as applying a liquid containing a material of a self-assembled monolayer.

As shown in FIG. 3C, a liquid is sprayed and deposited onto a surface of the substrate film 105 by the same method as described above, and therefore the plurality of microlens precursors 102 is formed. By hardening the plurality of formed microlens precursors 102, the plurality of microlenses 103 is obtained.

Thus, the provision of the substrate film 105 enables a microlens to be formed regardless of the material quality of the substrate 101. By this provision, the shape of a microlens can also be readily adjusted.

Regions with different affinities, namely a region with a high affinity (a lyophilic region) and a region with a low affinity (a lyophobic region), may be formed on the substrate 101.

Figure 4A:
FIGS. 4A, 4B, and 4C are schematics illustrating a method for manufacturing a microlens when regions with different affinities are created in an exemplary embodiment.
Figure 4B:
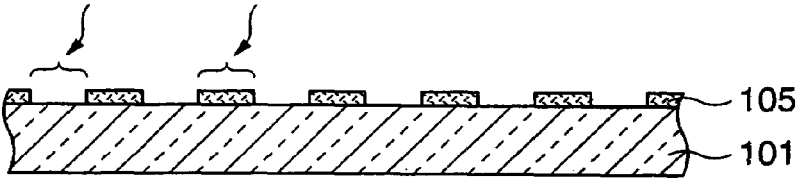
Figure 4C:
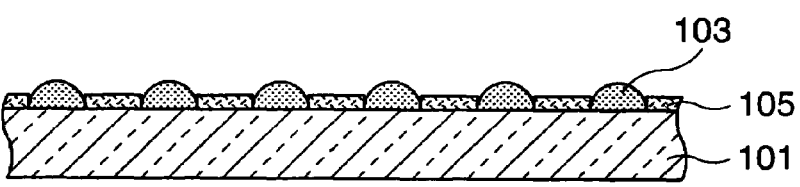

FIGS. 4A, 4B, and 4C show views for illustrating the method for manufacturing a microlens when regions with different affinities are created.

The patterned lyophobic substrate film 105 is formed on the substrate 101 shown in FIG. 4A. After the lyophobic substrate film 105 is formed over the substrate 101 having good wettability, for example, part of the substrate film 105 is removed by light, such as an electron beam (EB) or vacuum ultra violet (VUV) light or a laser beam, such that the substrate film 105 having a desired pattern can be obtained. A lyophilic region 109 and a lyophobic region 111 can therefore be formed on a surface of the substrate 101 (refer to FIG. 4B).

A liquid containing a microlens formation material is then sprayed onto the substrate film 105 on which the desired pattern is formed. The microlens 103 can therefore be selectively formed in the lyophilic region 109, as shown in FIG. 4B.

According to this example, by suitably adjusting a pattern of the substrate film 105, a microlens can be formed in a desired position with excellent accuracy. By altering the size and the form of the lyophilic region 109, the size and the form of a microlens can also be adjusted.

Next, a further aspect of the method for manufacturing a microlens of the exemplary embodiments will be described.

FIGS. 5A, 5B, 5C, and 5D are views for illustrating another example of the manufacturing method of a microlens of the exemplary embodiments.

In this example, instead of forming a microlens by spraying, an etching protective film is formed.

Figure 5A:
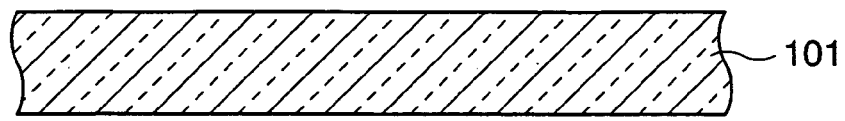
FIGS. 5A, 5B, 5C, and 5D are schematics illustrating another example of a manufacturing method of a microlens in an exemplary embodiment.
Figure 5B:
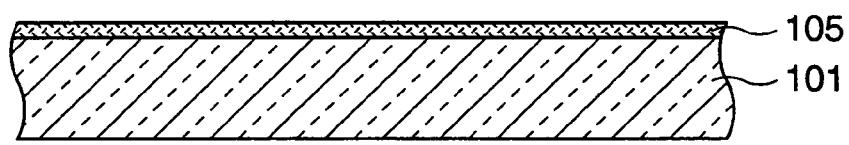
Figure 5C:
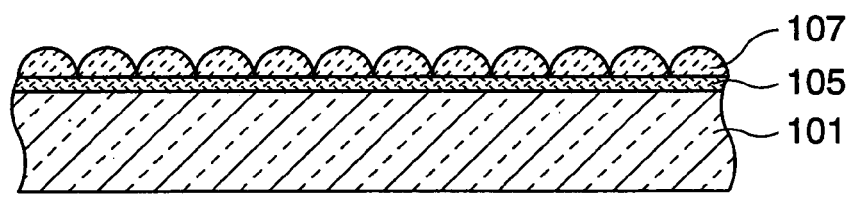

The substrate film 105 is formed on the substrate 101 shown in FIG. 5A in the same way as the above (FIG. 5B). As shown in FIG. 5C, a liquid that contains a material for forming an etching protective film and has a low affinity to a surface of the substrate 101 is sprayed, deposited, and hardened onto the substrate film 105.

The material for forming an etching protective film in this case is suitably selected in accordance with the material quality of the substrate 101, the method of etching, the type of a etchant, and the like.

Figure 5D:
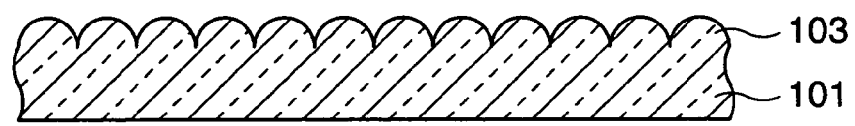

Thus, the shape of an etching protective film can be transferred onto the substrate 101 as shown in FIG. 5D. The substrate 101 on which the microlens 103 is integrally formed can thereby be obtained. As a result, in comparison with the formation of the microlens 103 that is made of a different material from the substrate, the optical loss can be reduced.

Method for Manufacturing Organic Electroluminescence Element

An example of the method for manufacturing an organic EL element of the exemplary embodiments will now be described with reference to the drawings.

FIGS. 6A to 6D and 7A to 7D are views for illustrating an example of the method for manufacturing an organic EL element of the present embodiment.

Figure 6A:
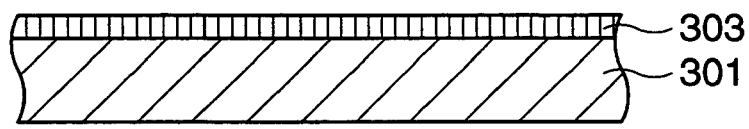
FIGS. 6A, 6B, 6C, and 6D are schematics illustrating an example of the manufacturing method of an organic EL element in an exemplary embodiment.

As shown in FIG. 6A, a transparent electrode (a first electrode) 303 as an anode is formed on a surface of a substrate (a base material) 301 by, for example, a sputtering method.

Although the material of the substrate 301 is not particularly restricted in this case, a transparent substrate made of glass, resin, or the like, is used when the substrate is used as a light-extraction surface (a light exit surface). Silica glass, blue glass, borate glass, silicate glass, phosphate glass, phosphosilicate glass, borosilicate glass, etc., can be used as glass. Polyethylene, terephthalate, polycarbonate, polyethersulfone, polyarylate, polymethacrylate, polyacrylate, polystyrene, etc., are used as resin.

Before forming the transparent electrode, surface treatment, especially by polishing, etc., may be performed to a surface of the base material. Thus, the surface of the transparent electrode can be smoothed. As a result, shortening the distance between electrodes and occurrence of a short circuit, which are caused by the unevenness of the surface, can be avoided.

Metal, alloys, conductive compounds, and their mixtures that have large work functions and can provide a desired transparent electrode (a transparent electrode film) can be used as materials for forming a transparent electrode used in the present exemplary embodiment. Specifically, metal such as Au, Ag, and Al having the thickness that does not damage the transparency and dielectric transparent materials such as Indium-Tin-Oxide (ITO), $SnO_2$, and ZnO can be suitably used. The thickness of the transparent electrode, which is not particularly restricted, is, for example, about 100 nm to 200 nm.

Figure 6B:
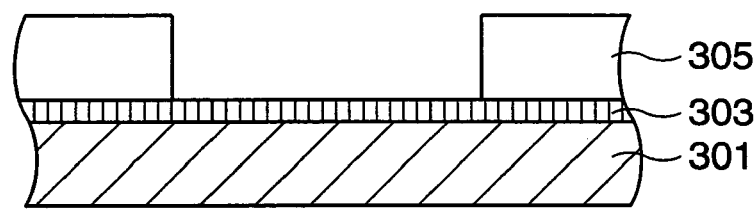

As shown in FIG. 6B, a dielectric film is formed of silicon nitride, etc., by deposition, etc., and then a portion corresponding to a pixel region is removed by etching, etc., thereby forming a bank 305 made of the dielectric film.

Figure 6C:
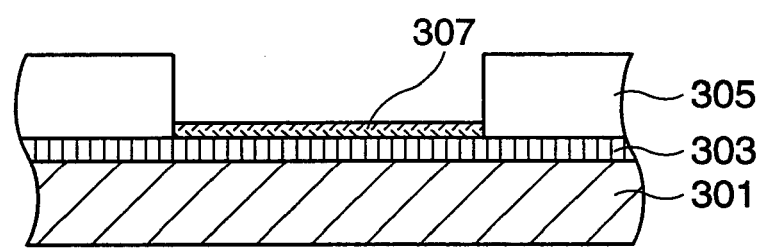

As shown in FIG. 6C, a substrate film 307 is formed on a portion of the transparent electrode 303 that corresponds to a pixel formation region mutually separated by the bank 305.

As this substrate film 307, a film having an affinity to a material liquid of a microlens, to be formed in the later step (a liquid containing a microlens formation material), lower than that of the transparent electrode 303 (more lyophobic), is preferred. A material that has the contact angle to the material liquid of the microlens preferably equal to 50° or more, more preferably equal to 60° or more, and further preferably equal to 70° or more, is preferred. Such a material tends to enable the formation of a microlens having a higher focal performance. The substrate film 307 preferably has a material and/or a film thickness that does not interrupt conductivity between electrodes (between the transparent electrode 303 and a cathode 317). Although the thickness of the substrate film 307 differs with the material, or the like, and is therefore not restricted, it is, for example, about 1 nm to 20 nm. A material used for the substrate film 307 specifically includes lyophobic resin such as fluorocarbon polymers, and polyolefins. From the viewpoint of excellent stability and smoothness of the substrate film 307, the use of a lyophobic self-assembled monolayer such as flouroalkylsilane is preferable.

The method for forming the substrate film 307 differs with the material used and is therefore not particularly restricted. Specifically, a coating method, a spraying method, or a sputtering method, for example, can be used suitably according to conditions.

Figure 6D:
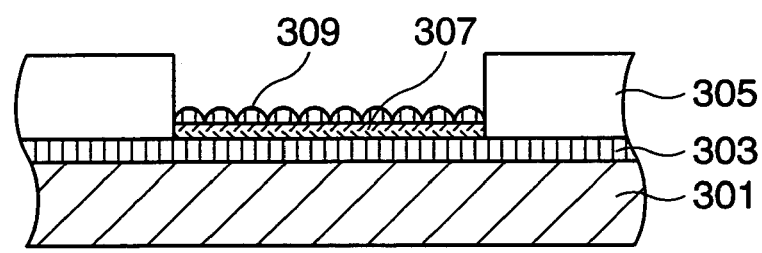

As shown in FIG. 6D, a microlens 309 is formed on the substrate film 307 by spraying and hardening a liquid that contains a material for forming a microlens.

Spraying a liquid so as to produce a particle having an average diameter equal to or less than 1 μm, and preferably equal to or less than 0.5 μm, is specifically preferred. The minute microlens 309 having an average diameter equal to or less than 5 μm, and preferably equal to or less than 1 μm can thereby be formed. Such a spraying method specifically includes, for example, a LSMCD method. This method can readily form a micron and sub micron size micro droplet.

A transparent or semitransparent material that can carry out the function as a lens after being hardened is preferable as a microlens formation material. Specifically, a transparent or semitransparent material that has, for example, conductivity is used. As an example of such a material, the same material (e.g. ITO) as that constituting the transparent electrode 303 is preferably used. If the microlens 309 is formed on the glass substrate 301, or the like as described below, the conductivity is not required for the material.

Figure 7A:
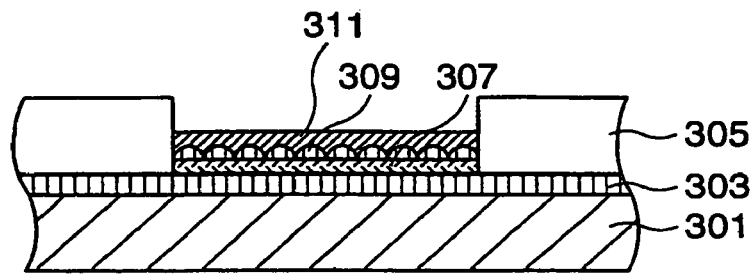
FIGS. 7A, 7B, 7C, and 7D are schematics illustrating an example of the manufacturing method of an organic EL element in an exemplary embodiment.

As shown in FIG. 7A, a hole transfer layer 311 is formed by deposition, or the like.

Materials for forming the hole transfer layer 311 (hole transfer materials) include, for example, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, polysilane compounds, aniline copolymers, and specific conducting polymer oligomers such as thiophene oligomers, and the like.

Figure 7B:
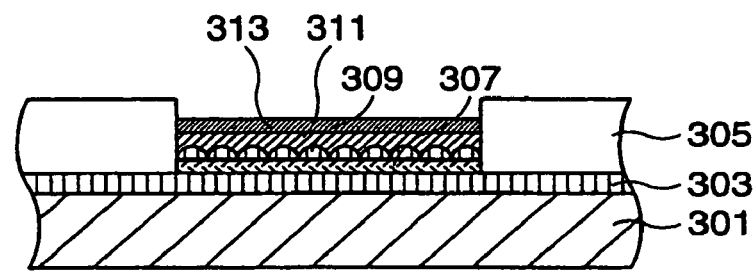

As shown in FIG. 7B, an organic luminescent layer 313 is further formed on the hole transfer layer 311 by deposition, an ink-jet method, or the like.

Materials for forming the organic luminescent layer 313 (organic luminescent materials) include, for example, benzothiazole, benzimidazole, and benzoxazole fluorescent brighteners; metal chelated oxinoid compounds; styrylbenzene compounds; distyrylpyrazine derivatives; aromatic dimethylidine compounds; and the like. Although the organic luminescent layer 313 is formed of only an organic luminescent material, it may be formed of a mixture between an organic luminescent material and a hole transfer material and/or an electron injection material. Specific examples of a material of the organic luminescent layer 313 in this case are molecularly doped polymers where organic luminescent materials such as coumarin are dispersed in polymers such as polymethyl methacrylate, bisphenol A, polycarbonate (PC), etc.; polymer family where distyrylbenzene derivatives are introduced in polycarbonate skeletons; or the family where oxadiazole derivatives of electron injection properties are dispersed in conjugated polymers such as polyphenylenevinyl (PPV) derivative family, polyalkylthiophene (PAT) derivative family, polyalkylfluorene (PAF) derivative family, polyphenylene (PP) derivative family, and polyarylene (PA) derivative family, or in polyvinylcarbazole of hole transfer properties.

Figure 7C:
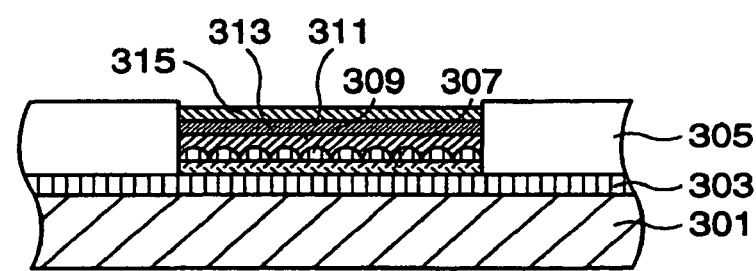

As shown in FIG. 7C, an electron injection layer 315 is formed on the organic luminescent layer 313 by deposition.

Materials of the electron injection layer 315 (electron injection materials) include, for example, nitro-substituted fluorenone derivatives, anthraquinodimethane derivatives, diphenylquinone derivatives, thiopyranedioxide derivatives, heterocyclic tetracarboxylic acid anhydrides such as naphthaleneperylene, carbodiimides, fluorenilidenemethane derivatives, anthrone derivatives, oxadiazole derivatives, 8-quinolinol derivatives, and other electron transfer compounds.

Figure 7D:
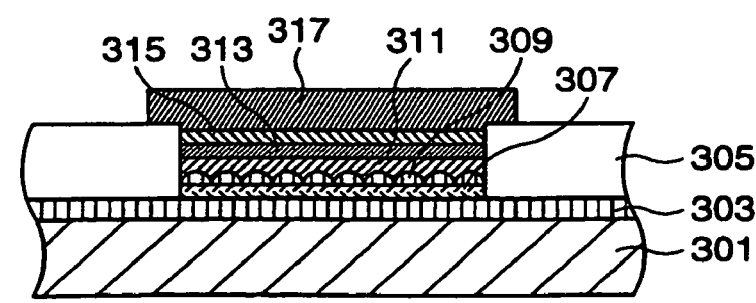

As shown in FIG. 7D, the cathode layer (cathode) 317 is formed on the electron injection layer 315 by deposition or a sputtering method, and as a result, an organic EL element is obtained.

Metal, alloys, conductive compounds, and their mixtures that have small work functions can be used as materials for the cathode layer 317. Specifically, natrium, magnesium, lithium, alloys or mixed metal of magnesium and silver, indium, rare earth metal, and the like can be used suitably.

According to the method for manufacturing an organic EL element of the present exemplary embodiment, a material liquid (a microlens formation material) with micro particle size that has been atomized as described above is deposited onto a lyophobic base material, thereby readily forming a minute microlens. Providing such a minute microlens between layers of an organic EL element can reduce the optical loss caused by a refractive index difference between layers of the organic EL element, without a need for accuracy of position of the microlens, compared with the formation of a microlens in correspondence to each organic EL element.

Although the microlens 309 is formed on the substrate film 307 in the above described example, the microlens 309 may be formed without the use of the substrate film 307 when an affinity between the transparent electrode 303 itself and the material liquid is low. The microlens 309 may also be formed by the use of patterning of the substrate film 307 and formation of a lyophilic region as well as a lyophobic region. In this case, in order to reduce the optical loss between the microlens 309 and the transparent electrode 303 that is the lower layer, it is preferable that the refractive index difference between the microlens formation material and the transparent electrode 303 be equal to or less than 0.05, and more preferably equal to or less than 0.02. Moreover, it is preferable that the refractive indices of a microlens formation material and a material constituting the transparent electrode 303 be substantially equal. When a microlens is formed on a glass substrate, the microlens may be formed by the use of etching of the glass substrate, as described above.

Figure 8A:
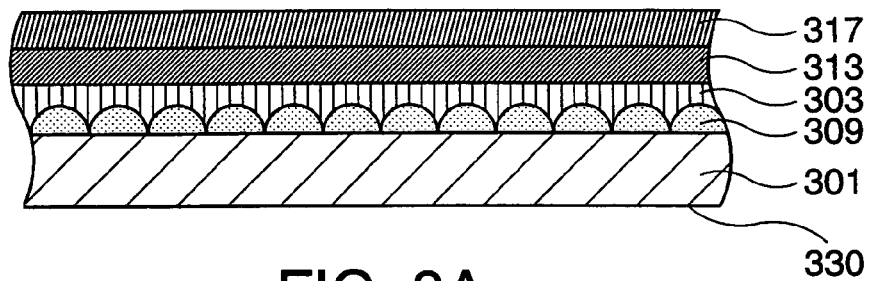
FIGS. 8A and 8B are schematics illustrating another example of a structure of an organic EL element manufactured by the manufacturing method of an organic EL element in an exemplary embodiment.
Figure 8B:
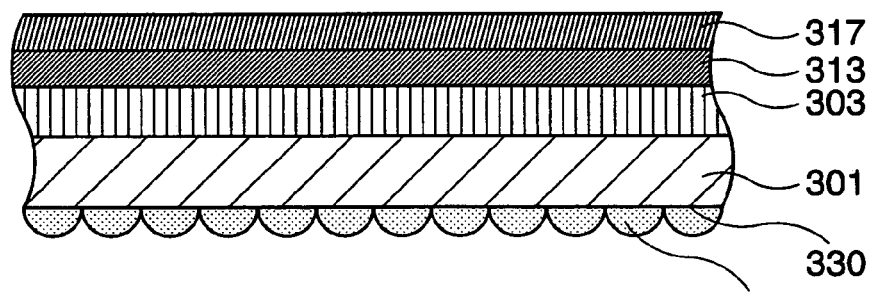

In the above described example, the microlens 309 is formed between the transparent electrode 303 and the hole transfer layer 311, but this is not restrictive. As shown in FIGS. 8A and 8B, the microlens 309 may be formed between any layers from the organic luminescent layer 313 to a light exit surface 330 or on the light exit surface 330.

In the above described example, description is also given using an instance of stacking each layer on the substrate 301 at the light-extraction surface side (the light exit surface side). The formation of a microlens is not restricted to this instance; when each layer is stacked on the substrate at the opposite side to the light-extraction surface, a microlens can also be formed between the layers constituting the organic EL element in the same way as in this instance. The substrate in this case may be a semitransparent or transparent substrate. A transistor for driving the organic EL element and other units may be formed in the substrate.

The layer construction of an organic EL element is also not particularly restricted to the above described example, and may be, for example, the following (1) to (8). In the following (1) to (8), the layer constructions are described in the order of stacking layers on a substrate.

(1) Anode (transparent electrode)/hole transfer layer/organic luminescent layer/electron injection layer/cathode (mirror surface electrode);

(2) Anode (transparent electrode)/hole transfer layer/organic luminescent layer/cathode (mirror surface electrode);

(3) Anode (transparent electrode)/organic luminescent layer/electron injection layer/cathode (mirror surface electrode);

(4) Anode (transparent electrode)/hole transfer layer/organic luminescent layer/adhesive layer/cathode (mirror surface electrode);

(5) Anode (transparent electrode)/organic luminescent layer/cathode (mirror surface electrode);

(6) Anode (transparent electrode)/mixed layer of hole transfer material, organic luminescent material, and electron injection material/cathode (mirror surface electrode);

(7) Anode (transparent electrode)/mixed layer of hole transfer material and organic luminescent material/cathode (mirror surface electrode); and (8) Anode (transparent electrode)/mixed layer of organic luminescent material and electron injection material/cathode (mirror surface electrode).

In addition to the above layers, a hole injection layer, an electron transfer layer, and other layers may be included as necessary. Materials used for such layers are not particularly restricted.

Electro-Optic Device and Electronic Equipment

The method for manufacturing a microlens and the method for manufacturing an organic EL element of the exemplary embodiments can be preferably utilized for a method for manufacturing electro-optic devices and electronic equipment. That is, by utilizing the above described manufacturing method of an organic EL element (organic thin film element) for a manufacturing method of electro-optic devices and electronic equipment, long lifetime electro-optic devices and electronic equipment can be provided by the use of simple steps.

The electro-optic devices in this case are the devices that utilize the electro-optic effect, and include, for example, organic EL display devices.

Figure 9:
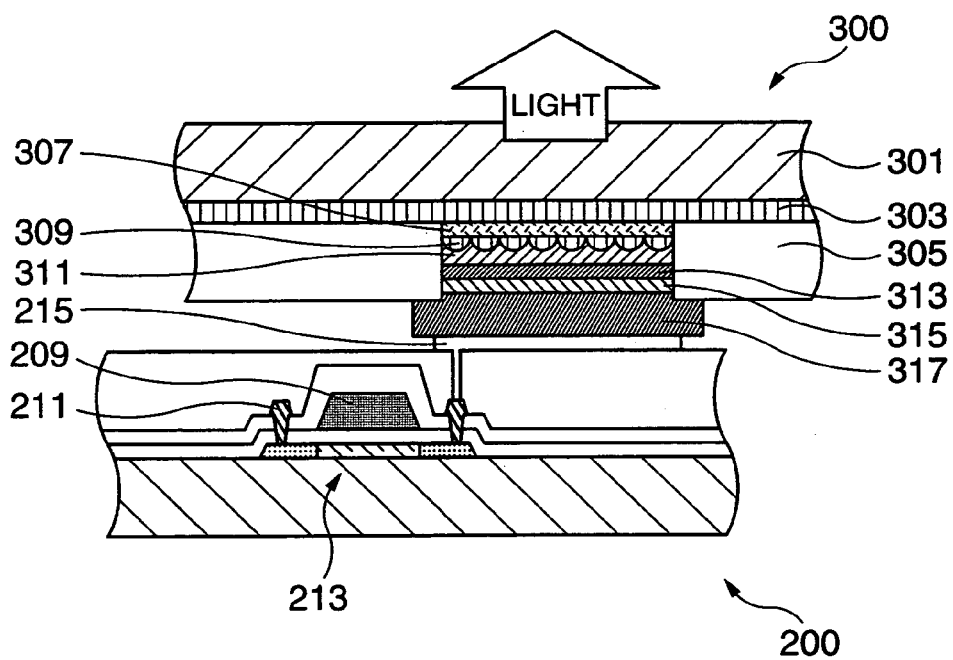
FIG. 9 is a schematic illustrating an example of an organic EL device in an exemplary embodiment.

FIG. 9 shows an example of the organic EL devices. As shown in FIG. 9, an organic EL device can be formed, for example, by combining an organic EL element 300 manufactured as described above with a substrate (hereinafter, TFT substrate) 200 on which a thin film transistor is formed. Note that the TFT substrate 200 mainly includes a semiconductor film 213, a dielectric film 203, a gate electrode 209, an interlayer dielectric film 205, metal wiring 211, a protective film 207, and a pixel electrode 215 on a substrate 201 made of glass or the like.

The number of the organic EL elements 300, which constitute the organic EL device, may be one or may be more than one. When the plurality of organic EL elements 300 is placed, the luminous colors of the organic EL elements 300 may be the same or may be different from one another. The organic EL elements 300 of single type or a plurality of types are formed in a desired shape such that the organic EL device as a whole has a desired luminous color. For example, in order to create a white luminous color of the organic EL device as a whole, the organic EL element 300 that emits red light, an organic EL element that emits green light, and an organic EL element that emits blue light are located in stripe shape, mosaic shape, triangle shape, four pixel location shape, or the like. The luminous color of the individual organic EL element 300 varies according to the type of the organic luminescent material, and therefore the type of the organic luminescent material to be used is suitably selected such that the organic EL device as a whole has a desired luminous color.

Although the above described example illustrates a top emission type organic EL display device, an organic EL display device is not restricted to this example and may be a bottom emission type organic EL display device.

Although the above described organic EL element is formed on the substrate, one or double protective layers for preventing the organic EL element from invading moisture may be placed so as to cover the organic EL element formed on the substrate since an organic EL element is generally vulnerable to moisture.

Such organic EL display devices can be used for various types of electronic equipment. FIGS. 10A to 10D and FIGS. 11A and 11B are views showing examples of various types of electronic equipment that include electro-optic devices 600 (such as organic EL display devices).

Figure 10A:
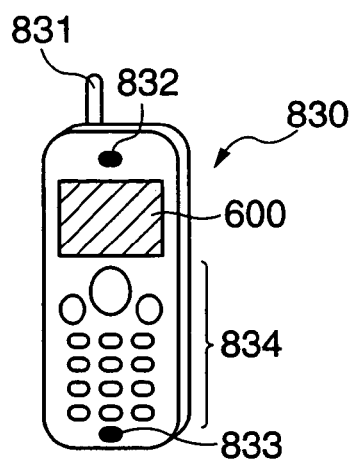
FIGS. 10A, 10B, 10C, and 10D are schematics illustrating examples of various types of electronic equipment containing electro-optic devices (such as organic EL display devices) in an exemplary embodiment.
Figure 10B:
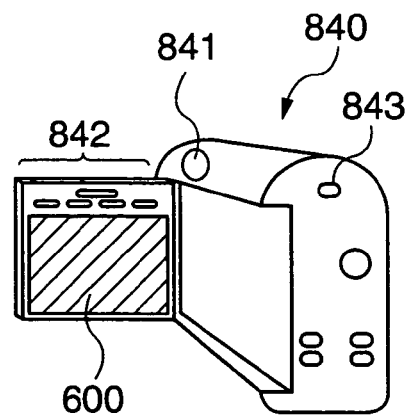
Figure 10C:
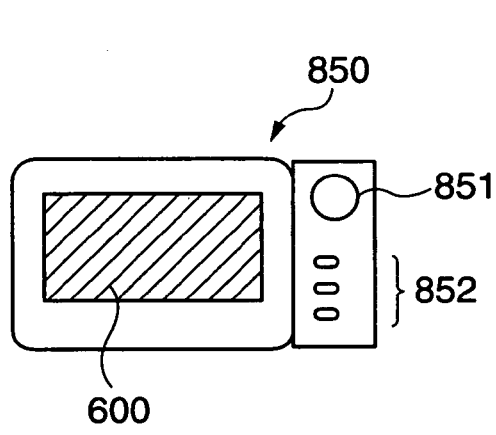
Figure 10D:
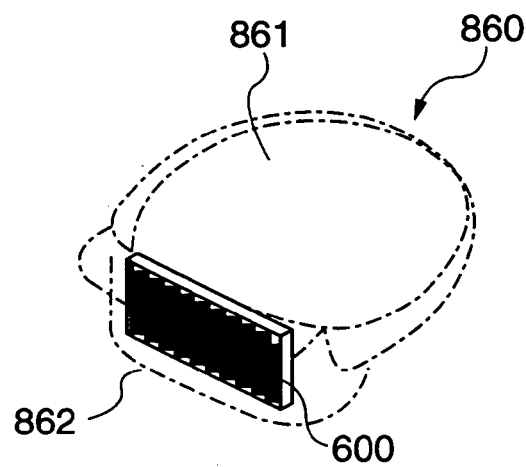

FIG. 10A is an example of the application to a cellular phone. A cellular phone 830 includes an antenna 831, a sound output section 832, a sound input section 833, an operation section 834, and the electro-optic device 600 of the invention. FIG. 10B is an example of the application to a video camera. A video camera 840 includes a picture section 841, an operation section 842, a sound input section 843, and the electro-optic device 600. FIG. 10C is an example of the application to a portable type personal computer (so-called PDA). A computer 850 includes a camera section 851, an operation section 852, and the electro-optic device 600. FIG. 10D is an example of the application to a head mount display. A head mount display 860 includes a band 861, an optical system storage section 862, and the electro-optic device 600.

Figure 11A:
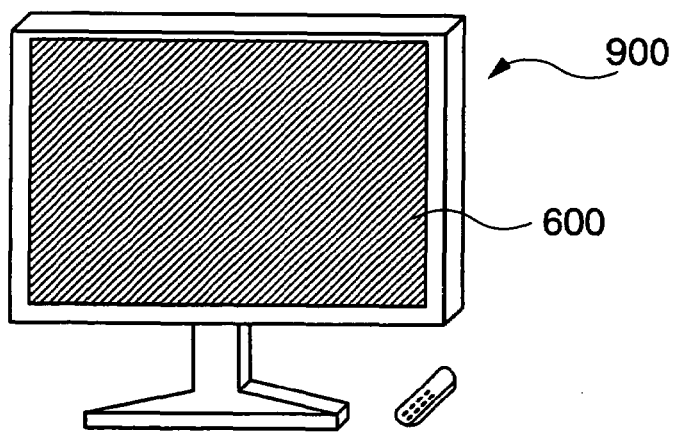
FIGS. 11A and 11B are schematics illustrating examples of various types of electronic equipment containing electro-optic devices (such as organic EL display devices) in an exemplary embodiment.
Figure 11B:
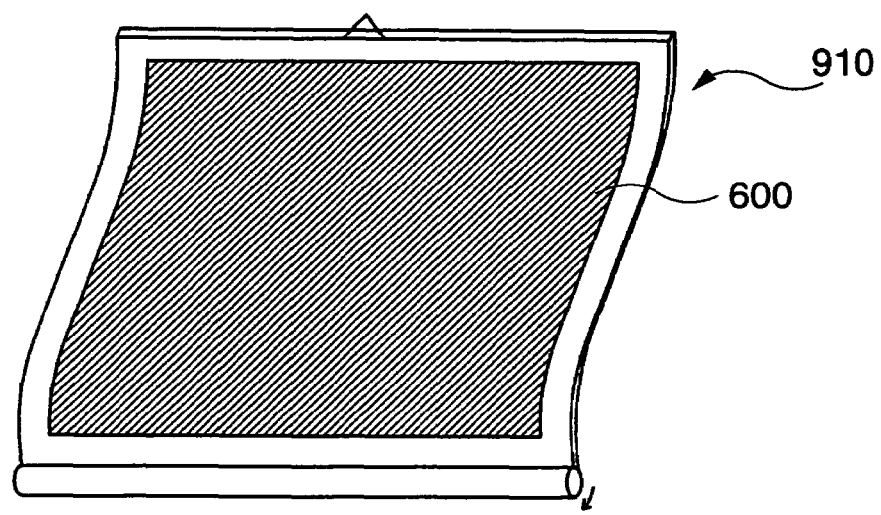

FIG. 11A is an example of the application to a television set. A television set 900 includes the electro-optic device 600. The electro-optic device 600 can also be applied to a monitoring device used for a personal computer or the like. FIG. 11B is an example of the application to a roll-up type television set. A roll-up type television set 910 includes the electro-optic device 600.

The above described examples illustrate organic EL display devices as instances of electro-optic devices, but electro-optic devices to which the methods of the exemplary embodiments are applied are not restricted to these examples. The methods of the exemplary embodiments can be applied to manufacturing methods of electro-optic devices that use other various types electro-optic elements (such as plasma light-emitting elements, electrophoretic elements, and liquid crystal elements). Electro-optic devices are not restricted to the above described examples, and can be utilized for electronic equipment such as a surface illuminant, a liquid crystal display device or a pack light of a watch, a character display device, a device for electric spectaculars, an indicator for automobile use, a light source for a eliminator of a copying machine, a light source for a printer, and an optical modulation device.

EXAMPLES

Example 1

An indium-tin-oxide (ITO) film as an anode formed on a transparent glass substrate of 25×75×1.1 mm by a sputtering method was prepared as a base material. At that time, the average surface roughness Ra after sputtering was 7.33 nm. A solution containing flouroalkylsilane (FAS) was then applied onto the ITO film such that a substrate film having lyophobicity was formed. A liquid containing a microlens formation material (a material liquid) was deposited onto the substrate film by a LSMCD method such that microlens precursors were formed. At that time, ITO was used as a microlens formation material in the same way as in forming the anode, and butyl acetate was used as a solvent. Then the microlens precursors were dried and annealed, and as a result, the microlenses were obtained. Because FAS did not evenly spread in a wet state on a surface due to its low affinity to the material liquid, convex lens shaped minute microlenses could be formed. Although the surface of the ITO film after sputtering did not have excellent smoothness, forming the microlenses by a LSMCD method caused improvement of the smoothness.

Figure 12:
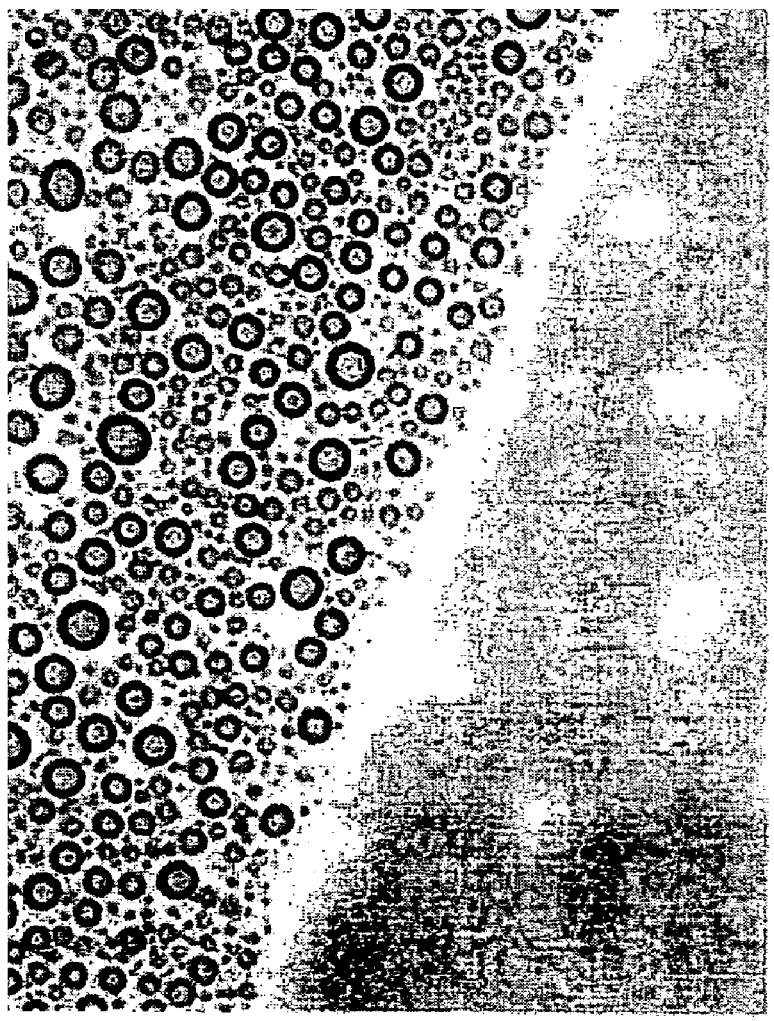
FIG. 12 is an electron micrograph of a microlens obtained by the manufacturing method of a microlens in an exemplary embodiment.

FIG. 12 shows an electron micrograph of the obtained microlens.

A hole transfer layer, an organic luminescent layer, and a cathode were formed one atop another on a microlens layer, and as a result, an organic EL element was obtained. The method for forming the hole transfer layer, the organic luminescent layer, and the cathode will be described below.

The glass substrate on which the ITO film was formed as described above was fixed to a substrate holder of a vacuum deposition device, 200 mg of N,N'-diphenyl-N,N'-bis(3-methylphenyl)-(1,1'-biphenyl)-4,4'-diamine (hereinafter, TPD) was put into a resistance heating boat made of molybdenum and 200 mg of tris(8-quinoline)aluminum (hereinafter, Alq) was put into another resistance heating boat made of molybdenum, and the inside of a vacuum chamber was depressurized to $1 \times 10^{-4}$ Pa.

Then, the resistance heating boat in the first stage in which the TPD was put was heated to 215 to 220° C., and the TPD was deposited onto the ITO film with a deposition speed of 0.1 to 0.3 nm/sec, forming a hole transfer layer with a film thickness of 60 nm. The substrate temperature at that time was set at room temperature. Then, without taking the substrate on which the hole transfer layer was formed out of a vacuum chamber, the formation of an organic luminescent layer was subsequently performed. As for the formation of the organic luminescent layer, the resistance heating boat in which the Alq was put was heated to 275° C., and the Alq was deposited with a depositing speed of 0.1 to 0.2 nm/sec onto the hole transfer layer, forming an Alq layer with a film thickness of 50 nm. The substrate temperature at that time was also set at room temperature. Then 1 g of magnesium was put into a resistance heating boat made of molybdenum, 500 mg of indium was put into another resistance heating boat made of molybdenum, and the inside of a vacuum chamber was depressurized to $2 \times 10^{-4}$ Pa. The resistance heating boat made of molybdenum in which the magnesium was put was heated to about 500° C., and the magnesium was deposited with a deposition speed of about 1.7 to 2.8 nm/sec, while the resistance heating boat made of molybdenum in which the indium was put was heated to about 800° C., and the indium was deposited with a deposition speed of about 0.03 to 0.08 nm/sec. Thus, a cathode (a mirror surface electrode) made of mixed metal of magnesium and indium with a film thickness of 150 nm was formed on the organic luminescent layer. As a result, an organic EL element that includes the anode (ITO film), the hole transfer layer, the organic luminescent layer, and the cathode formed one atop another on the substrate was obtained.

Example 2

A solution containing flouroalkylsilane (FAS) was applied onto a transparent glass substrate of 25×75×1.1 mm prepared as a base material such that a substrate film having lyophobicity was formed. A liquid containing a microlens formation material (a material liquid) was then deposited onto the substrate film by a LSMCD method, and therefore microlens precursors were formed. At that time, a dispersion liquid in which $SiO_2$ was dispersed in butyl acetate was used as the microlens formation material. Then, the microlens precursors were dried and annealed, and therefore microlenses were obtained. Since FAS did not evenly spread in a wet state on a surface due to its low affinity to the material liquid, convex lens shaped minute microlenses could be formed. Then a material liquid containing ITO was deposited onto a microlens array layer by a LSMCD method, and then dried and annealed, and thus a transparent electrode as an anode was obtained. Forming the ITO film by a LSMCD method enabled formation of the ITO film having a smooth surface.

Then, a hole transfer layer, an organic luminescent layer, and a cathode were formed one atop another on the microlens layer, and as a result, an organic EL element was obtained.

Example 3

A solution containing flouroalkylsilane (FAS) was applied onto a transparent glass substrate of 25×75×1.1 mm prepared as a base material such that a substrate film having lyophobicity was formed. A liquid containing an etching protective film formation material (a material liquid) was then deposited onto the substrate film by a LSMCD method, and thus an etching protective film having the shape of a plurality of convex lenses was formed. At that time, ITO was used as the etching protective film formation material. Then the pattern of an etching protective film was transferred to the glass substrate, and therefore the glass substrate on which microlenses were integrally formed was obtained. Then a material liquid containing ITO was deposited onto a microlens array layer by a LSMCD method and then dried and annealed, and thus a transparent electrode as an anode was obtained. Forming the ITO film by a LSMCD method enabled formation of the ITO film having a smooth surface.

Then, a hole transfer layer, an organic luminescent layer, and a cathode were formed one atop another on the microlens layer, and as a result, an organic EL element was obtained.

Example 4

A solution containing flouroalkylsilane (FAS) was applied onto a transparent glass substrate of 25×75×1.1 mm prepared as a base material such that a substrate film having lyophobicity was formed. The substrate film was then exposed to VUV light using a mask and patterned such that a lyophilic region and a lyophobic region were formed. A material liquid in which $SiO_2$ was dispersed in butyl acetate was then deposited onto the patterned substrate film by a LSMCD method. In depositing, $SiO_2$ was selectively deposited in the lyophilic region. The substrate film was then dried and annealed, and thus microlenses were obtained. Then, a material liquid containing ITO was deposited onto this microlens layer by a LSMCD method and then dried and annealed, and thus a transparent electrode as an anode was obtained. Forming the ITO film by a LSMCD method enabled formation of the ITO film having a smooth surface.

Then, a hole transfer layer, an organic luminescent layer, and a cathode were formed one atop another on the microlens layer, and as a result, an organic EL element was obtained.

In this example, since $SiO_2$ is formed in accordance with the pattern of the lyophilic region and the lyophobic region, the surface shape can be readily adjusted.

What is claimed is:

1. A method for manufacturing an organic electroluminescence element, the method comprising:
    forming a first electrode on a substrate;
    forming a bank on the substrate so that the bank overlaps with a first part of the first electrode;
    forming a substrate film on a second part of the first electrode with which the bank does not overlap, the substrate film including a polyolefin having a thickness between 1 to 20 nm;
    spraying a plurality of droplets to attach the plurality of droplets on the substrate film, each of the plurality of droplets having transparency characteristics, a contact angle between each of the plurality of droplets and the substrate film being more than 50°;
    hardening the plurality of the droplets attached on the substrate film to form a plurality of microlenses on the substrate film, each of the plurality of microlenses and the first electrode including a same conductive material;
    forming an organic electroluminescence film on the plurality of microlenses; and
    forming a second electrode on the organic electroluminescence film, electrons being transferred between the first and second electrodes and passing the substrate film.

2. The method for manufacturing an organic electroluminescence element according to claim 1, a refractive index difference between a material for forming the microlens and a material comprising a layer on which the microlens is formed being equal to or less than 0.05.

3. The method for manufacturing an organic electroluminescence element according to claim 1, a refractive index of each of the plurality of microlenses and a refractive index of the first electrode being substantially equal.

4. The method for manufacturing an organic electroluminescence element according to claim 1, the plurality of microlenses being configured to collect a light emitted from the organic electroluminescence film.

5. The method for manufacturing an organic electroluminescence element according to claim 1, the plurality of microlenses being configured to collect a light emitted from the organic electroluminescence film and to emit the collected light to the substrate.

6. The method of manufacturing an organic electroluminescence element according to claim 1, the plurality of droplets being sprayed by a liquid source misted chemical deposition method.

* * * * *